(12) United States Patent
Liu

(10) Patent No.: US 11,271,159 B2
(45) Date of Patent: Mar. 8, 2022

(54) MANUFACTURING METHOD OF TANDEM ORGANIC LIGHT EMITTING DIODE DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Ming Liu, Shenzhen (CN)

( * ) Notice: Subject to any disclaimer, the term of this patent is extended or adjusted under 35 U.S.C. 154(b) by 218 days.

(21) Appl. No.: 16/616,977

(22) PCT Filed: Nov. 5, 2019

(86) PCT No.: PCT/CN2019/115503
§ 371 (c)(1),
(2) Date: Nov. 26, 2019

(87) PCT Pub. No.: WO2021/042488
PCT Pub. Date: Mar. 11, 2021

(65) Prior Publication Data
US 2021/0336140 A1  Oct. 28, 2021

(30) Foreign Application Priority Data
Sep. 6, 2019  (CN) .......................... 201910844180.4

(51) Int. Cl.
*H01L 51/50* (2006.01)
*H01L 51/00* (2006.01)
(Continued)

(52) U.S. Cl.
CPC ...... *H01L 51/0005* (2013.01); *H01L 51/0037* (2013.01); *H01L 51/0042* (2013.01); *H01L 51/0072* (2013.01); *H01L 51/0085* (2013.01); *H01L 51/5072* (2013.01); *B82Y 20/00* (2013.01); *B82Y 30/00* (2013.01);
(Continued)

(58) Field of Classification Search
None
See application file for complete search history.

(56) References Cited

U.S. PATENT DOCUMENTS

2016/0293676 A1   10/2016  Komatsu
2017/0022605 A1*  1/2017   Takiguchi .............. C23C 14/24
(Continued)

FOREIGN PATENT DOCUMENTS

CN  106531772 A  3/2017
CN  107275499 A  10/2017
(Continued)

*Primary Examiner* — Dung A. Le

(57) ABSTRACT

A manufacturing method of a tandem OLED device is provided, including the following steps: providing an anode; using an ink printing technology to form an organic electroluminescence component on the anode; furthermore, the organic electroluminescence component includes a plurality of organic electroluminescence units disposed in stacks, and each of the organic electroluminescence units includes a hole injection layer, a hole transport layer, a light emitting layer, an electron transport layer, and an electron injection layer which are disposed sequentially; and forming the cathode on a side of the organic electroluminescence component away from the anode.

15 Claims, 3 Drawing Sheets

(51) Int. Cl.
*B82Y 20/00* (2011.01)
*B82Y 30/00* (2011.01)
*B82Y 40/00* (2011.01)

(52) U.S. Cl.
CPC ............ *B82Y 40/00* (2013.01); *H01L 51/504* (2013.01); *H01L 51/5056* (2013.01); *H01L 51/5088* (2013.01); *H01L 2251/56* (2013.01)

(56) References Cited

U.S. PATENT DOCUMENTS

| | | | |
|---|---|---|---|
| 2017/0250346 A1* | 8/2017 | Seo | H01L 51/0072 |
| 2017/0279062 A1* | 9/2017 | Yan | H01L 51/5024 |
| 2018/0226024 A1 | 8/2018 | Tang | |
| 2018/0327622 A1* | 11/2018 | Pan | C09D 11/037 |
| 2019/0221623 A1 | 7/2019 | Kamiyama | |
| 2020/0091434 A1* | 3/2020 | Mou | H01L 51/0043 |
| 2021/0036236 A1* | 2/2021 | Kim | C07D 409/14 |
| 2021/0066619 A1* | 3/2021 | Lee | H01L 51/0073 |
| 2021/0193876 A1* | 6/2021 | Chen | H01L 33/06 |

FOREIGN PATENT DOCUMENTS

| | | |
|---|---|---|
| CN | 107565039 A | 1/2018 |
| CN | 108039416 A | 5/2018 |
| CN | 108091777 A | 5/2018 |
| CN | 109768173 A | 5/2019 |
| CN | 110047873 A | 7/2019 |
| WO | 2015072143 A1 | 5/2015 |

\* cited by examiner

MANUFACTURING METHOD OF TANDEM ORGANIC LIGHT EMITTING DIODE DEVICE

FIELD OF INVENTION

The present disclosure relates to the field of display panel technology, and particularly relates to a manufacturing method of a tandem organic light emitting diode (OLED) device.

BACKGROUND OF INVENTION

The statement herein only provides background information about the present disclosure but does not inevitably constitute the prior art.

Organic electroluminescence devices are also known as organic light emitting diodes (OLEDs), which have advantages, such as being self-illuminous, wide viewing angles, almost infinite contrast, low power consumption, ultimate quick response speed, light weight, wide temperature adaptation ranges, large areas, fully cured, and flexible, and have important applications in the fields of displays and illumination. A technique used on a tandem OLED is that making a plurality of independent light emitting units be disposed in stacks to have currents with same intensities sequentially pass through the plurality of light emitting units to emit light together, thereby light emitting brightness and efficiency of the tandem OLED being improved and conducive to improving efficiency and service life of the OLED device.

Presently, the most common used manufacturing method for OLEDs in one section is using an ink-jet printing method to manufacture a hole injection layer, a hole transport layer, and a light emitting layer, and using a vacuum thermal evaporation method to manufacture an electron transport layer, an electron injection layer, and a cathode. Because cost of the vacuum thermal evaporation method is high, the production costs of the OLEDs is high, limiting widespread commercialization of the OLEDs. The ink-jet printing method has advantages, such as a high material utilization rate and conducive to large-scale manufacturing, which is key technique to solve the problem of production costs of the OLED displays. However, because a mutual soluble phenomenon easily occurs between adjacent ink-jet printing layers, materials of the electron transport layer, the electron injection layer, and the cathode are mostly evaporation materials, and film layers of the evaporation materials are easy to be dissolved during meet solvents, resulting in manufacturing OLEDs by the ink-jet printing method being difficult to realize. Furthermore, the tandem OLED is composed of a plurality of the light emitting unit stacks, a total number of film layers is more than that of the OLED in one section. If using the evaporation method to manufacture the tandem OLED, this will greatly increase production costs and will cause a lot of material waste. If using the evaporation method to manufacture the electron transport layer and the electron injection layer of the tandem OLED, and using the ink-jet printing method to manufacture other light emitting functional layers, this will increase difficulty of the technology and production costs.

SUMMARY OF INVENTION

The present disclosure provides a manufacturing method of a tandem OLED device, manufacturing each film layer of a plurality of organic electroluminescence units disposed in stacks in the tandem OLED device by an ink-jet printing technology, which solves the technical problem of high production costs and great difficulty of the technology of the tandem OLED device.

In order to solve the problems mentioned above, the present disclosure provides the technical solutions as follows:

The present disclosure provides a manufacturing method of a tandem organic light emitting diode (OLED) device, including the following steps:

Providing an anode.

Using an ink printing technology to form an organic electroluminescence component on the anode. Furthermore, the organic electroluminescence component includes a plurality of organic electroluminescence units disposed in stacks, and each of the organic electroluminescence units includes a hole injection layer, a hole transport layer, a light emitting layer, an electron transport layer, and an electron injection layer which are disposed sequentially.

Forming a cathode on a side of the organic electroluminescence component away from the anode.

In the manufacturing method of the tandem OLED device provided by the present disclosure, materials of the hole injection layers in each of the organic electroluminescence units are same; an ink material used for manufacturing the hole injection layer includes a poly(3,4-ethylenedioxythiophene) polystyrene sulfonate (PEDOT:PSS) intrinsically conductive polymer and a N,N-dimethylformamide solvent.

In the manufacturing method of the tandem OLED device provided by the present disclosure, in the ink material used for manufacturing the hole injection layer, a mass fraction of the PEDOT:PSS intrinsically conductive polymer is 5%.

In the manufacturing method of the tandem OLED device provided by the present disclosure, materials of the hole transport layers of each of the organic electroluminescence units are same; an ink material used for manufacturing the hole transport layer includes polyvinylcarbazole and a m-dichlorobenzene solvent.

In the manufacturing method of the tandem OLED device provided by the present disclosure, in the ink material used for manufacturing the hole transport layer, a mass fraction of the polyvinylcarbazole is 8%.

In the manufacturing method of the tandem OLED device provided by the present disclosure, materials of the light emitting layers of each of the organic electroluminescence units are same; an ink material used for manufacturing the light emitting layer includes 2,6-bis[3-(9H-Carbazol-9-yl)phenyl]pyridine (26DCzPPy), tris(2-phenylpyridine)iridium ($Ir(ppy)_3$), and a toluene solvent.

In the manufacturing method of the tandem OLED device provided by the present disclosure, in the ink material used for manufacturing the light emitting layer, a mass ratio of the 26Dczppy and the $Ir(ppy)_3$ is 10:1, and a total mass fraction of the 26Dczppy and the $Ir(ppy)_3$ is 5%.

In the manufacturing method of the tandem OLED device provided by the present disclosure, materials of the electron transport layers of each of the organic electroluminescence units are same; an ink material used for manufacturing the electron transport layer includes zinc oxide nanoparticles and a 2-ethoxyethanol dispersant.

In the manufacturing method of the tandem OLED device provided by the present disclosure, in the ink material used for manufacturing the electron transport layer, the zinc oxide nanoparticles are distributed evenly in the 2-ethoxyethanol, and a mass fraction of the zinc oxide nanoparticles is 5%.

In the manufacturing method of the tandem OLED device provided by the present disclosure, materials of the electron injection layers of each of the organic electroluminescence units are same; an ink material used for manufacturing the electron injection layer includes 4,7-diphenyl-1,10-phenanthroline (Bphen), a compound A, and a tetrahydrofuran solvent; wherein a chemical structure of the compound A as follows:

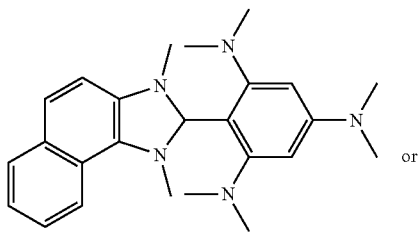

or

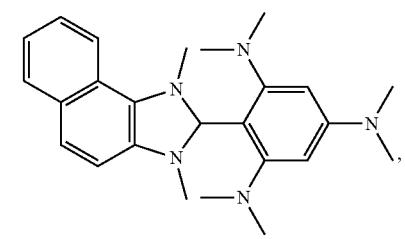

or other derivatives of

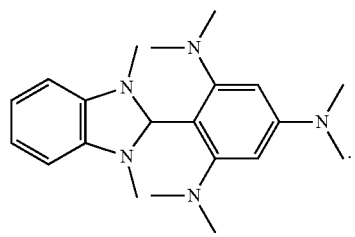

In the manufacturing method of the tandem OLED device provided by the present disclosure, in the ink material used for manufacturing the electron injection layer, a mass ratio of the Bphen and the compound A is 20:1, a mass fraction of the Bphen and the compound A is 5%.

In the manufacturing method of the tandem OLED device provided by the present disclosure, in the plurality of organic electroluminescence units disposed in stacks, a compound A is doped in the electron injection layer of the organic electroluminescence unit adjacent to the anode, a chemical structure of the compound A is illustrated as follow:

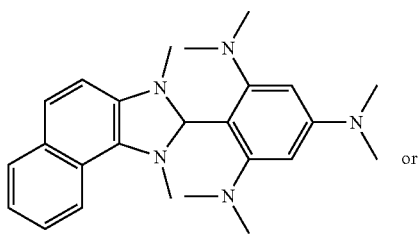

or

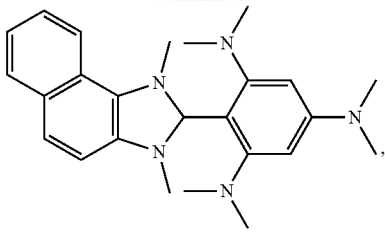

or other derivatives of

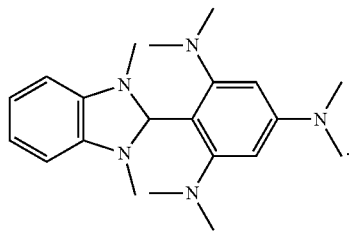 [SMILES: CN(C)c1cc(N(C)C)c(C2N(C)c3ccccc3N2C)c(N(C)C)c1]

In the manufacturing method of the tandem OLED device provided by the present disclosure, the tandem OLED device includes a substrate and a pixel definition layer disposed on the substrate, and the anode is disposed on the substrate.

Before using the ink-jet printing technology to form the organic electroluminescence component on the anode, including following steps:

Forming the pixel definition layer on the substrate where the anode is formed. Furthermore, the pixel definition layer is corresponded to the anode and is disposed with pixel openings, and the organic electroluminescence component is formed in the pixel openings.

In the manufacturing method of the tandem OLED device provided by the present disclosure, a material of the cathode includes an aluminum metal or an alloy of a magnesium metal and a silver metal.

In the manufacturing method of the tandem OLED device provided by the present disclosure, during manufacturing the hole injection layer, the hole transport layer, the light emitting layer, the electron transport layer, or the electron injection layer of each of the organic electroluminescence units, after ink printing a corresponding ink material, first drying in a vacuum, then baking at 80° C. to remove a solvent in the ink material.

The present disclosure further provides a manufacturing method of a tandem organic light emitting diode (OLED) device, including the following steps:

Providing an anode.

Using an ink printing technology on the anode to form a first organic electroluminescence unit and a second organic electroluminescence unit on the anode which are disposed in stacks. Furthermore, the first organic electroluminescence unit includes a first hole injection layer, a first hole transport layer, a first light emitting layer, a first electron transport layer, and a first electron injection layer which are disposed sequentially on the anode; the second organic electroluminescence unit includes a second hole injection layer, a second hole transport layer, a second light emitting layer, a second electron transport layer, and a second electron injection layer which are sequentially disposed on the first electron injection layer Forming a cathode on a side of the second electron injection layer away from the anode.

In the manufacturing method of the tandem OLED device provided by the present disclosure, an ink material used for manufacturing the first hole injection layer and the second hole injection layer includes a PEDOT:PSS intrinsically conductive polymer and a N,N-dimethylformamide solvent.

An ink material used for manufacturing the first hole transport layer and the second hole transport layer includes polyvinylcarbazole and a m-dichlorobenzene solvent.

An ink material used for manufacturing the first light emitting layer and the second light emitting layer includes 26DCzPPy, Ir(ppy)$_3$, and a toluene solvent.

An ink material used for manufacturing the first electron transport layer and the second electron transport layer includes zinc oxide nanoparticles and a 2-ethoxyethanol dispersant.

An ink material used for manufacturing the first electron injection layer and the second electron injection layer includes Bphen, a compound A, and a tetrahydrofuran solvent. Furthermore, a chemical structure of the compound A as follows:

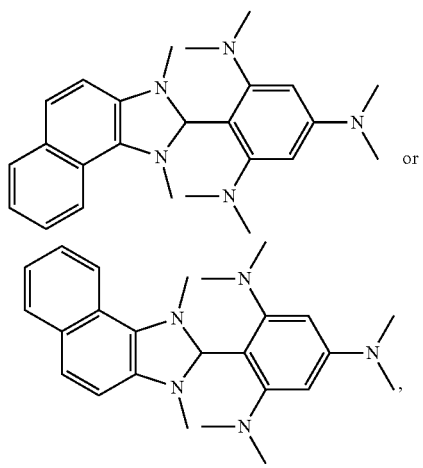

or other derivatives of

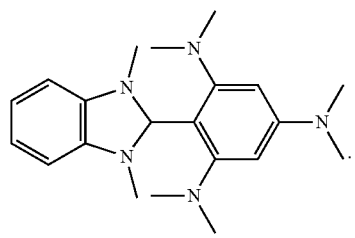 [SMILES: CN(C)c1cc(N(C)C)c(C2N(C)c3ccccc3N2C)c(N(C)C)c1]

In the manufacturing method of the tandem OLED device provided by the present disclosure, in the ink material used for manufacturing the first hole injection layer and the second hole injection layer, a mass fraction of the PEDOT:PSS intrinsically conductive polymer is 5%.

In the ink material used for manufacturing the first hole transport layer and a second hole transport layer, a mass fraction of the polyvinylcarbazole is 8%;

In the ink material used for manufacturing the first light emitting layer and the second light emitting layer, a mass ratio of the 26Dczppy and the Ir(ppy)$_3$ is 10:1, and a total mass fraction of the 26Dczppy and the Ir(ppy)$_3$ is 5.

In the ink material used for manufacturing the first electron transport layer and the second electron transport layer, the zinc oxide nanoparticles are distributed evenly in the 2-ethoxyethanol, and a mass fraction of the zinc oxide nanoparticles is 5%.

In the ink material used for manufacturing the first electron injection layer and the second electron injection layer, a mass ratio of the Bphen and the compound A is 20:1, a mass fraction of the Bphen and the compound A is 5%.

The beneficial effect of the present disclosure: except the anode and the cathode of the tandem OLED device of the present disclosure, each of the film layers of the plurality of stacked organic electroluminescence units can be manufactured by using the ink-jet printing method, which has advantages, such as a high material utilization rate and conducive to large-scale manufacturing, which lowers production costs and difficulty of the technology and prevents material waste; using the ink-jet printing method to manufacture the tandem OLED device, on one hand, it is necessary to select a solvent of an ink material of each layer to prevent from the solvent dissolving the bottom film layer during the ink-jet printing process, on another hand, it is necessary to select a dissoluble electron transport material and a dissoluble electron injection material to manufacture the electron transport layer and the electron injection layer respectively; the present disclosure provides ink material recipes of the hole injection layer, the hole transport layer, the light emitting layer, the electron transport layer, and the electron injection layer of each of the organic electroluminescence units, and the ink material recipe of each layer includes appropriate solvents and functional materials, which prevents from the solvent dissolving the bottom film layer during the ink-jet printing process, and meanwhile ensures good performance of the manufactured tandem OLED device.

DESCRIPTION OF DRAWINGS

To more clearly illustrate embodiments or the technical solutions of the present disclosure, the accompanying figures of the present disclosure required for illustrating embodiments or the technical solutions of the present disclosure will be described in brief. Obviously, the accompanying figures described below are only part of the embodiments of the present disclosure, from which those skilled in the art can derive further without making any inventive efforts.

DETAILED DESCRIPTION OF PREFERRED EMBODIMENTS

Figure 1:
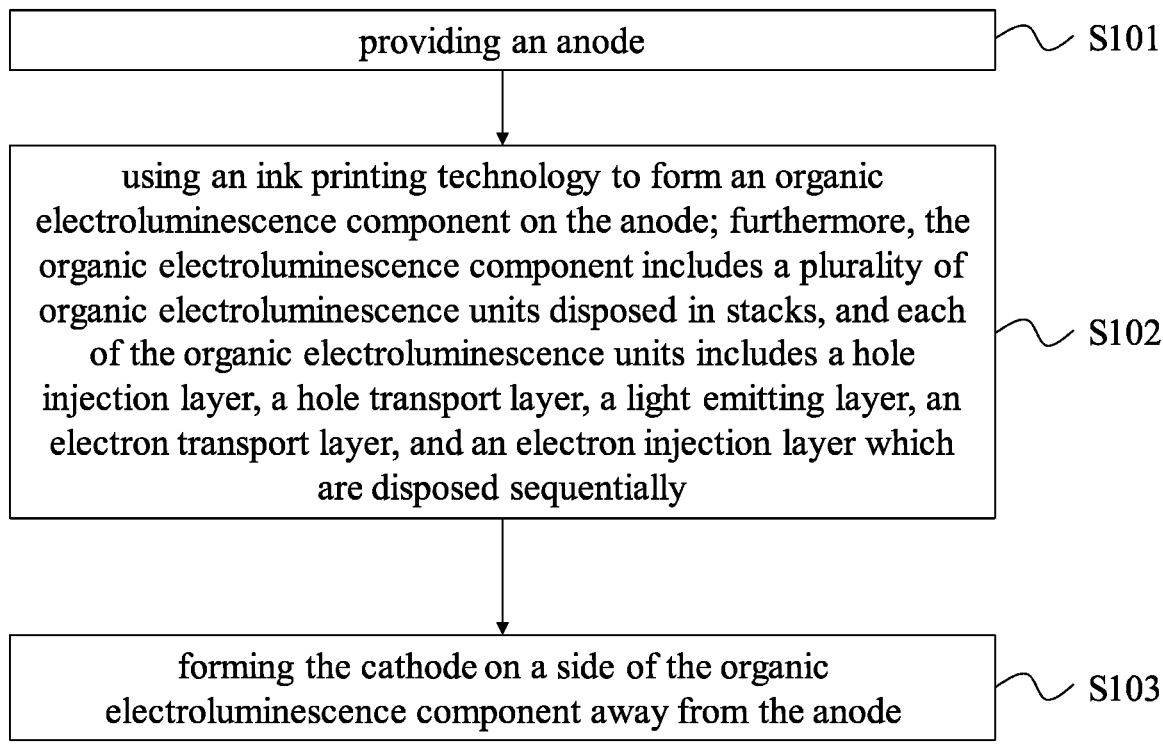
FIG. 1 is a flowchart of a manufacturing method of a tandem OLED device provided by an embodiment of the present disclosure.

The specific structural and functional details disclosed are merely representative and are for the purpose of describing exemplary embodiments of the present disclosure. However, the present disclosure may be specifically implemented in many alternative forms and should not be construed as being limited only to the embodiments set forth herein.

In the description of the present disclosure, it is to be understood that the orientation or positional relationship indicated by the terms "center", "transverse", "upper", "lower", "left", "right", "vertical", "horizontal", "top", "bottom", "inside", "outside", etc. is based on the orientation or positional relationship shown in the accompanying figures, which is merely for the convenience for describing of the present disclosure and for the simplification of the description, and is not intended to indicate or imply that the indicated devices or elements have a specific orientation or is constructed and operated in a specific orientation. Therefore, it should not be understood as a limitation on the present disclosure. Moreover, the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly. In the description of the present disclosure, unless it has another explanation, the meaning of "a plurality" is two or more. Moreover, the terms "comprising" any deformation of them are intended to cover non-exclusive inclusions.

In the description of the present disclosure, unless specified or limited otherwise, terms "mounted," "connected," "coupled," and the like are used in a broad sense, and may include, for example, fixed connections, detachable connections, or integral connections; may also be mechanical or electrical connections; may also be direct connections or indirect connections via intervening structures; may also be inner communications of two elements. For persons skilled in the art in this field, the specific meanings of the above terms in the present disclosure can be understood with specific cases.

The terms used herein is for the purpose of describing specific embodiments only and is not intended to limit exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

The present disclosure will be further described in detail below in combination with the drawings and embodiments.

Illustrated in FIG. 1 is a manufacturing method of a tandem organic light emitting diode (OLED) device provided by an embodiment of the present disclosure, including the following steps:

S101: providing an anode.

Specifically, a material of the anode includes indium tin oxide (ITO), and a thickness is 115 nm.

S102: using an ink printing technology to form an organic electroluminescence component on the anode. Furthermore, the organic electroluminescence component includes a plurality of organic electroluminescence units disposed in stacks, and each of the organic electroluminescence units includes a hole injection layer, a hole transport layer, a light emitting layer, an electron transport layer, and an electron injection layer which are disposed sequentially.

Figure 2:
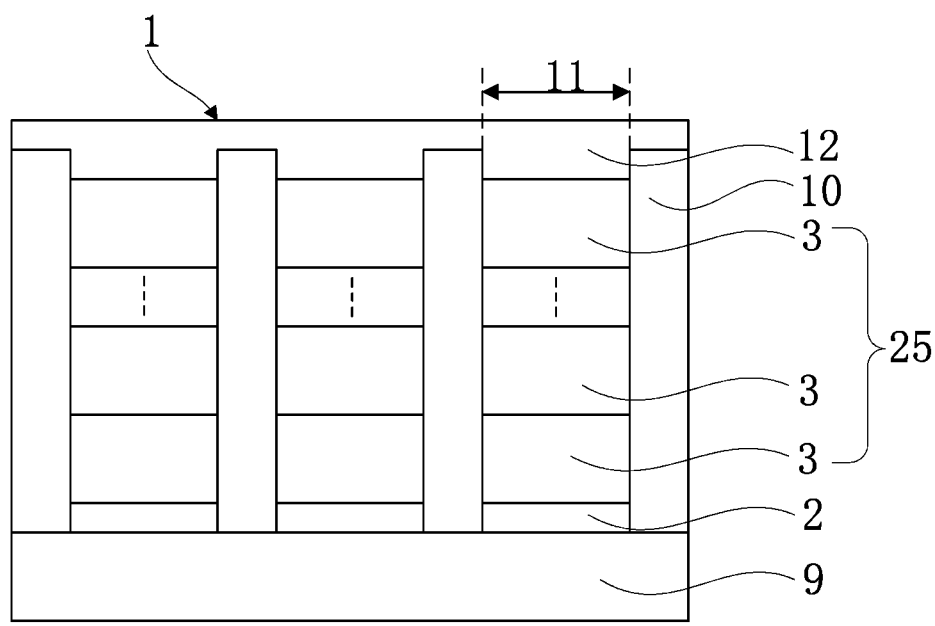
FIG. 2 is a structural schematic diagram of the tandem OLED device provided by an embodiment of the present disclosure.
Figure 3:
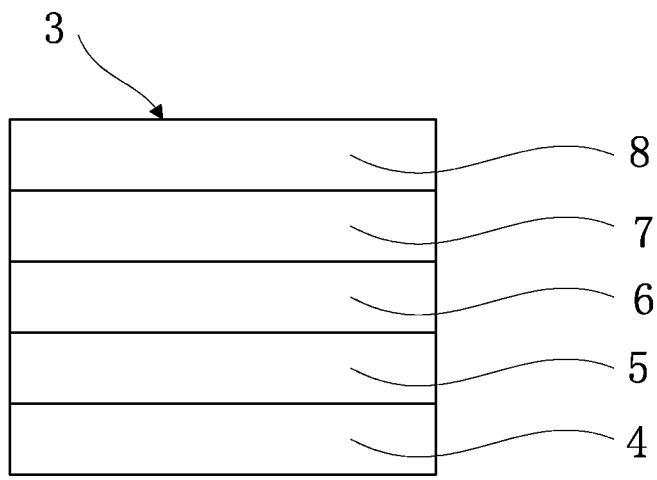
FIG. 3 is a structural schematic diagram of organic provided by an embodiment of the present disclosure.

As illustrated in FIG. 2 and FIG. 3, the plurality of organic electroluminescence units 3 are stacked on the anode 2 to form the organic electroluminescence component 25, and each of the organic electroluminescence units 3 includes the hole injection layer 4, the hole transport layer 5, the light emitting layer 6, the electron transport layer 7, and the electron injection layer 8 are disposed sequentially. It should be noted that in the plurality of organic electroluminescence units disposed in stacks, the electron injection layer 8 of any one of the organic electroluminescence units 3 (except the electron injection layer 8 of the organic electroluminescence unit 3 adjacent to the cathode 12) is adjoined on the hole injection layer 4 of the adjacent organic electroluminescence unit 3 to constitute two tandem (stacked) structures of the organic electroluminescence units to provide electrons and electron holes respectively.

Specifically, materials of the hole injection layers 4 in each of the organic electroluminescence units are same, and an ink material used for manufacturing the hole injection layer includes a poly(3,4-ethylenedioxythiophene) polystyrene sulfonate (PEDOT:PSS) intrinsically conductive polymer and a N,N-dimethylformamide solvent (DMF). Furthermore, a mass fraction of the PEDOT:PSS intrinsically conductive polymer is 5%. During manufacturing the hole injection layer 4, after the ink material is printed, it is first dried in a vacuum, and then is baked at 80° C. for one hour to remove the solvent to form the hole injection layer 4 with a film thickness of 40 nm.

Specifically, materials of the hole transport layers 5 of each of the organic electroluminescence units 3 are same, and an ink material used for manufacturing the hole transport layer 5 includes polyvinylcarbazole (PVK) and a m-dichlorobenzene solvent. Furthermore, a mass fraction of the polyvinylcarbazole is 8%. During manufacturing the hole transport layer 5, after the ink material is printed, it is first dried in a vacuum, and then is baked at 80° C. for ten minutes to remove the solvent to form the hole transport layer 5 with a film thickness of 30 nm.

Specifically, materials of the light emitting layers 6 of each of the organic electroluminescence units 3 are same, and an ink material used for manufacturing the light emitting layer 6 includes 2,6-bis[3-(9H-Carbazol-9-yl)phenyl]pyridine (26DCzPPy), tris(2-phenylpyridine)iridium ($Ir(ppy)_3$), and a toluene solvent. Furthermore, a mass ratio of the 26Dczppy and the $Ir(ppy)_3$ is 10:1, and a total mass fraction of the 26Dczppy and the $Ir(ppy)_3$ is 5%. During manufacturing the light emitting layer 6, after the ink material is printed, it is first dried in a vacuum first, and then is baked at 80° C. for ten minutes to remove the solvent to form the light emitting layer 6 with a film thickness of 20 nm.

Specifically, materials of the electron transport layers 7 of each of the organic electroluminescence units 3 are same, and an ink material used for manufacturing the electron transport layer 7 includes zinc oxide nanoparticles and a 2-ethoxyethanol dispersant. Furthermore, the zinc oxide nanoparticles are distributed evenly in the 2-ethoxyethanol, and a mass fraction of the zinc oxide nanoparticles is 5%. During manufacturing the electron transport layer 7, after the ink material is printed, it is first dried in a vacuum, and then is baked at 80° C. for thirty minutes to remove the dispersant to form the electron transport layer 7 with a film thickness of 30 nm.

Specifically, materials of the electron injection layers of each of the organic electroluminescence units 3 are same, and an ink material used for manufacturing the electron injection layer includes 4,7-diphenyl-1,10-phenanthroline (Bphen), a compound A, and a tetrahydrofuran solvent.

Furthermore, a mass ratio of the Bphen and the compound A is 20:1, a mass fraction of the Bphen and the compound A is 5%. During manufacturing the electron injection layer 8 after the ink material is printed, it is first dried in a vacuum, and then is baked at 80° C. for ten minutes to remove the solvent to form the electron injection layer 8 with a film thickness of 20 nm.

A chemical structure of the compound A as follows:

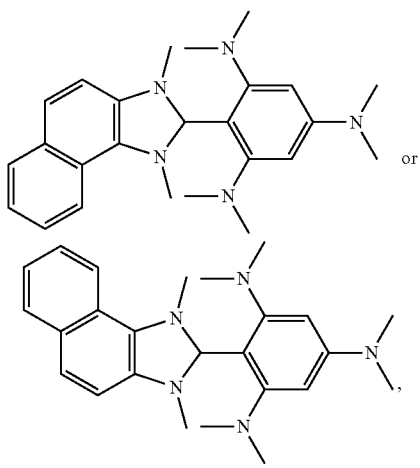

or other derivatives of

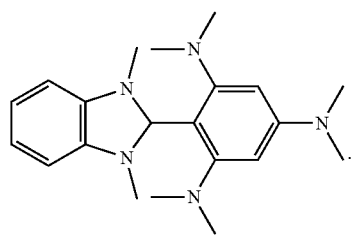 [SMILES: CN(C)c1cc(N(C)C)c(C2N(C)c3ccccc3N2C)c(N(C)C)c1]

The compound A is doped in the manufactured electron injection layer 8. When the compound A acts as a doped body, it can release electrons to serve effect of n-type doping, which can improve electron injection ability of the doped electron injection material Bphen.

Specifically, as illustrated in FIG. 2, the tandem OLED device further includes a substrate 9 and a pixel definition layer 10 disposed on the substrate 9, and the anode 2 is located on the substrate 9. Before the step S102, further includes the steps as follow:

Forming the pixel definition layer 10 on the substrate 9 where the anode 2 is formed. Furthermore, the pixel definition layer 10 is corresponded to the anode and is disposed with pixel openings 11, and the organic electroluminescence component 25 is formed in the pixel openings 11.

S103: forming the cathode on a side of the organic electroluminescence component away from the anode.

Illustrated in FIG. 2 is to form the cathode 12 on a side of the organic electroluminescence component 25 away from from the anode 2.

Specifically, a material of the cathode 12 includes an aluminum metal or an alloy of a magnesium metal and a silver metal. The cathode 12 is formed by using an evaporation method, and a thickness of the cathode 12 is 150 nm.

In this embodiment, except the anode 2 and the cathode 12 of the tandem OLED device 1, each of the film layers of the organic electroluminescence component 25 (the plurality of organic electroluminescence units 3 disposed in stacks) can be manufactured by using the ink-jet printing method, which has advantages, such as a high material utilization rate and conducive to large-scale manufacturing, and lowers production costs and difficulty of the technology of the tandem OLED device 1 and prevents material waste. Using the ink-jet printing method to manufacture the tandem OLED device, on one hand it is necessary to select a solvent of an ink material of each layer to prevent from the solvent dissolving the bottom film layer during the ink-jet printing process, on the other hand, it is necessary to select a dissoluble electron transport material and a dissoluble electron injection material to manufacture the electron transport layer and the electron injection layer respectively. This embodiment provides ink material recipes of the hole injection layer 4, the hole transport layer 5, the light emitting layer 6, the electron transport layer 7, and the electron injection layer 8 of each of the organic electroluminescence units 3, and the ink material recipe of each layer includes appropriate solvents and functional materials, which prevents from the dissolving of the bottom film layer during the ink-jet printing process, and meanwhile ensures good performance of the manufactured tandem OLED device 1.

An embodiment of the present disclosure further provides a manufacturing method of the tandem OLED device, and the difference with the embodiment mentioned above is that in the plurality of the organic electroluminescence units 3 disposed in stacks, the compound A is doped in the electron injection layer 8 of the organic electroluminescence unit 3 adjacent to the anode 2, and a chemical structure of the compound A is illustrated as follow:

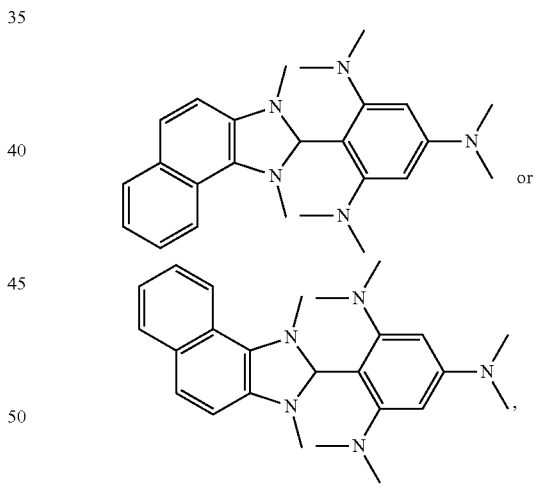

or other derivatives of

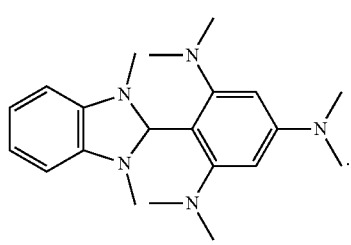 [SMILES: CN(C)c1cc(N(C)C)c(C2N(C)c3ccccc3N2C)c(N(C)C)c1]

Specifically, the electron injection layer 8 of the organic electroluminescence unit 3 adjacent to the anode 2 is formed by using the ink-jet printing technology, and the corresponded ink material includes Bphen, the compound A, and a tetrahydrofuran solvent. Further, a mass ratio of the Bphen and the compound A is 20:1, a mass fraction of the Bphen and the compound A is 5%. During manufacturing the electron injection layer 8, after the ink material is printed, it is first dried in a vacuum, and then it is baked at 80° C. for ten minutes to remove the solvent to form the electron injection layer 8 with a film thickness of 20 nm.

Specifically, the electron injection layers 8 of the other organic electroluminescence units 3 can be manufactured by using the ink-jet printing technology, and the ink material can be same as the ink material mentioned above, or can be other ink materials not including the compound A. Of course, the electron injection layers 8 of part of the organic electroluminescence units 3 can be manufactured by using the evaporation method, for example, evaporating lithium fluoride of a 1 nm thickness to form the electron injection layer 8 on the electron transport layer 7 of the organic electroluminescence unit 3 adjacent to the cathode 12. Because this electron injection layer 8 is the last electron injection layer, and the cathode 12 covering on this electron injection layer 8 is formed by the evaporation method, the electron injection layer 8 of the lithium fluoride is not ink printed by the ink material, it is not dissolved by the solvent.

In this embodiment, except the anode 2, the cathode 12, and the electron injection layers 8 of part of the organic electroluminescence units 2 of the tandem OLED device 1, the film layers of the plurality of the stacked organic electroluminescence units 3 can be manufactured by the ink-jet printing method, which has advantages, such as a high material utilization rate and conducive to large-scale manufacturing, and lowers production costs and difficulty of the technology of the tandem OLED device 1 and prevents material waste. Furthermore, the ink material recipes of the hole injection layer 4, the hole transport layer 5, the light emitting layer 6, the electron transport layer 7, and the electron injection layer 8 of each of the organic electroluminescence units 3, and the ink material recipe of the electron injection layer 8 of part of the organic electroluminescence units 3 are provided. The ink material recipes mentioned above include appropriate solvents to prevent from the solvents dissolving the bottom film layer during the ink-jet printing process. The electron injection layer 8 close to the cathode 12 can be manufactured by the ink-jet printing technology and also can be manufactured by the evaporation method, which provides various selections for the manufacture of the electron injection layer 8.

Figure 4:
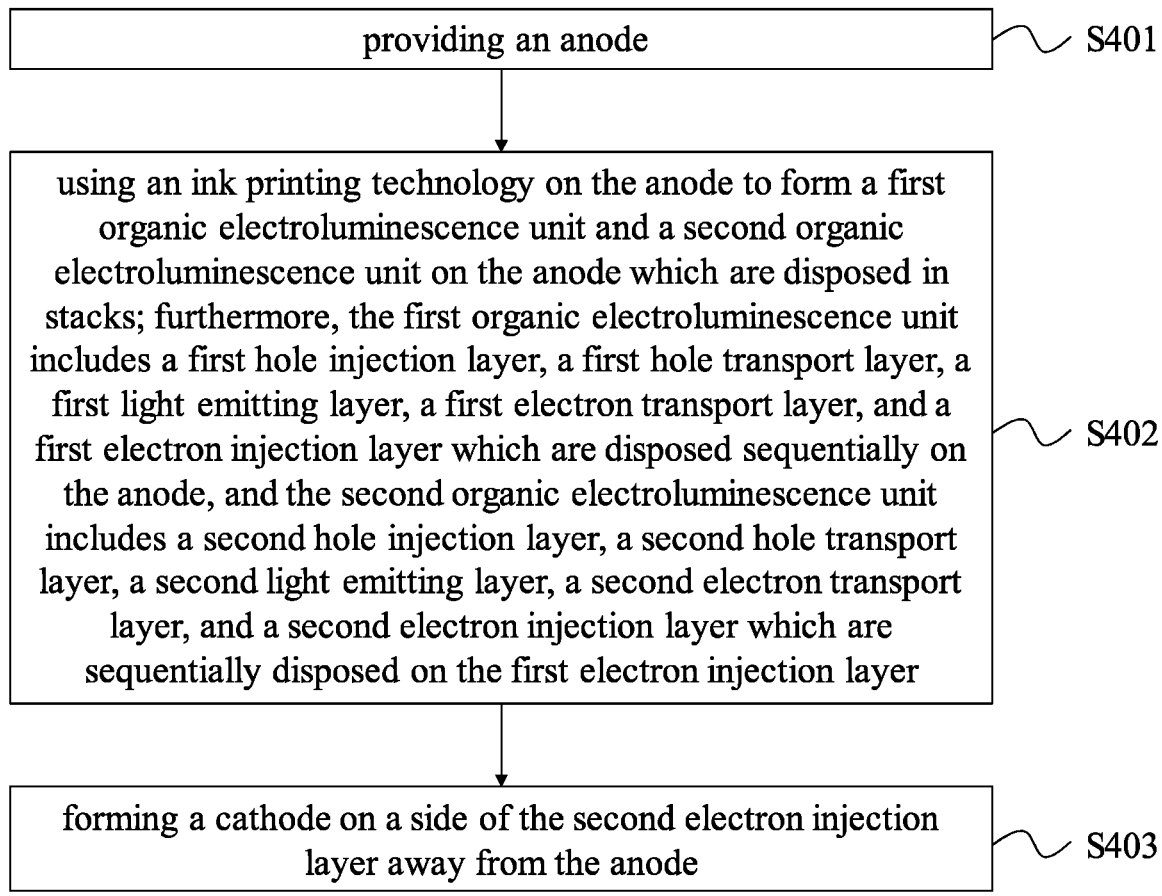
FIG. 4 is a flowchart of a manufacturing method of another tandem OLED device provided by an embodiment of the present disclosure.

As illustrated in FIG. 4, an embodiment of the present disclosure further provides a manufacturing method of the tandem OLED device, including the following steps:

S401: providing an anode.

Specifically, a material of the anode includes indium tin oxide (ITO), and a thickness is 115 nm.

S402: using an ink printing technology on the anode to form a first organic electroluminescence unit and a second organic electroluminescence unit on the anode which are disposed in stacks. Furthermore, the first organic electroluminescence unit includes a first hole injection layer, a first hole transport layer, a first light emitting layer, a first electron transport layer, and a first electron injection layer which are disposed sequentially on the anode, and the second organic electroluminescence unit includes a second hole injection layer, a second hole transport layer, a second light emitting layer, a second electron transport layer, and a second electron injection layer which are sequentially disposed on the first electron injection layer.

Figure 5:
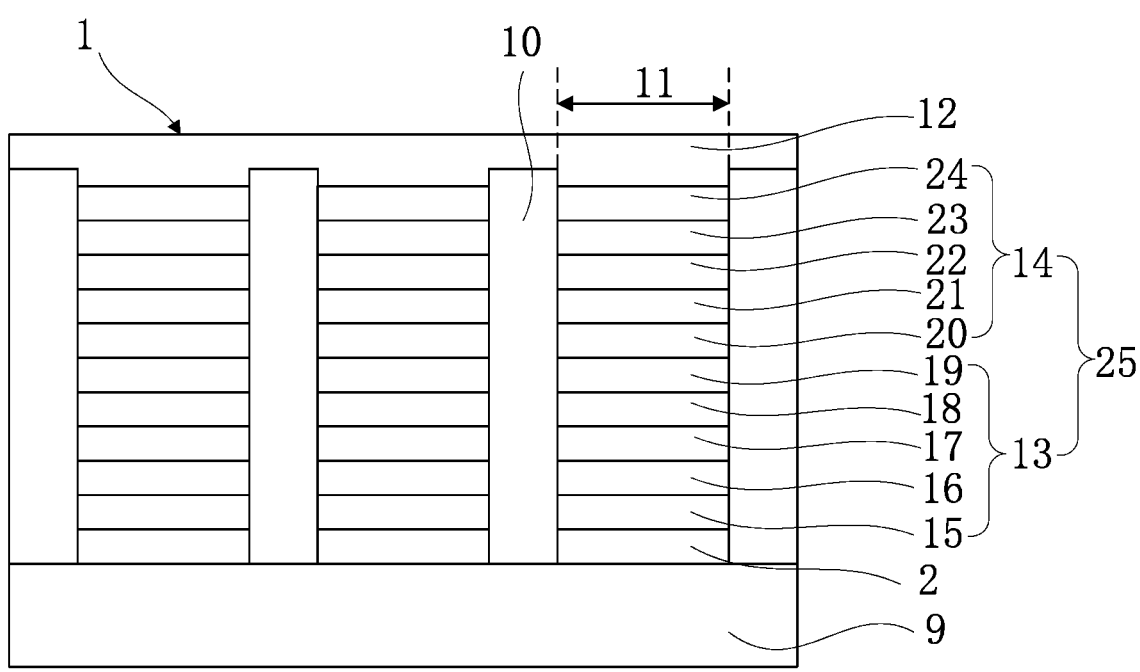
FIG. 5 is a structural schematic diagram of another tandem OLED device provided by an embodiment of the present disclosure.

As illustrated in FIG. 5, the first organic electroluminescence unit 13 and the second organic electroluminescence unit 14 are stacked on the anode 2. The first organic electroluminescence unit 13 includes a first hole injection layer 15, a first hole transport layer 16, a first light emitting layer 17, a first electron transport layer 18, and a first electron injection layer 19 which are disposed sequentially on the anode 2, and the second organic electroluminescence unit 14 includes a second hole injection layer 20, a second hole transport layer 21, a second light emitting layer 22, a second electron transport layer 23, and a second electron injection layer 24 which are sequentially disposed on the first electron injection layer 19.

Specifically, materials of the first hole injection layer 15 and the second hole injection layer 20 are same. An used ink material of manufacturing the first hole injection layer 15 and the second hole injection layer 20 includes PEDOT:PSS intrinsically conductive polymer and a N,N-dimethylformamide solvent. Furthermore, a mass fraction of the PEDOT:PSS intrinsically conductive polymer is 5%. During manufacturing the the first hole injection layer 15 or the second hole injection layer 20, after the ink material is printed, it is first dried in a vacuum, and then is baked at 80° C. for one hour to remove the solvent to form the first hole injection layer 15 or the second hole injection layer 20 with a film thickness in 40 nm.

Specifically, materials of the first hole transport layer 16 and the second hole transport layer 21 are same. An used ink material of manufacturing the first hole transport layer 16 and the second hole transport layer 21 includes polyvinylcarbazole and a m-dichlorobenzene solvent. Furthermore, a mass fraction of the polyvinylcarbazole is 8%. During manufacturing the first hole transport layer 16 or the second hole transport layer 21, after the ink material is printed, it is first dried in a vacuum, and then is baked at 80° C. for ten minutes to remove the solvent to form the first hole transport layer 16 or the second hole transport layer 21 with a film thickness in 30 nm.

Specifically, materials of the first light emitting layer 17 and the second light emitting layer 22 are same, and an ink material used for manufacturing the first light emitting layer 17 and the second light emitting layer 22 includes 26DCzppy, Ir(ppy)$_3$, and a toluene solvent. Furthermore, a mass ratio of the 26Dczppy and the Ir(ppy)$_3$ is 10:1, and a total mass fraction of the 26Dczppy and the Ir(ppy)$_3$ is 5%. During manufacturing the first light emitting layer 17 or the second light emitting layer 22, after the ink material is printed, it is dried first in a vacuum, and then is baked at 80° C. for ten minutes to remove the solvent to form the first light emitting layer 17 or the second light emitting layer 22 with a film thickness in 20 nm.

Specifically, materials of the first electron transport layer 18 and the second electron transport layer 23 are same, and an ink material used for manufacturing the first electron transport layer 18 and the second electron transport layer 23 includes zinc oxide nanoparticles and a 2-ethoxyethanol dispersant. Furthermore, the zinc oxide nanoparticles are distributed evenly in the 2-ethoxyethanol, and a mass fraction of the zinc oxide nanoparticles is 5%. During manufacturing the first electron transport layer 18 or the second electron transport layer 23, after the ink material is printed, it is first dried in a vacuum first, and then is baked at 80° C. for thirty minutes to remove the dispersant to form the first electron transport layer 18 or the second electron transport layer 23 with a film thickness in 30 nm.

Specifically, materials of the first electron injection layer 19 and the second electron injection layer 24 are same, and an ink material used for manufacturing the electron injection layer includes Bphen, a compound A, and a tetrahydrofuran solvent. Furthermore, a mass ratio of the Bphen and the compound A is 20:1, a mass fraction of the Bphen and the compound A is 5%. During manufacturing the first electron injection layer 19 or the second electron injection layer 24, after the ink material is printed, it is first dried in a vacuum, and then is baked at 80° C. for ten minutes to remove the solvent to form the first electron injection layer 19 or the second electron injection layer 24 with a film thickness of 20 nm. A chemical structure of the compound A as follows:

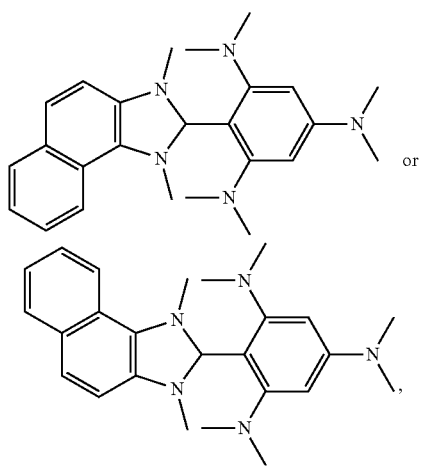

or other derivatives of

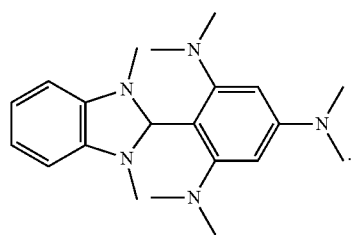 [SMILES: CN(C)c1cc(N(C)C)c(C2N(C)c3ccccc3N2C)c(N(C)C)c1]

The compound A is doped in the manufactured the first electron injection layer and the manufactured second electron injection layer. When the compound A acts as a doped body, it can release electrons to serve effect of n-type doping, which can improve electron injection ability of the doped electron injection material Bphen.

Specifically, as illustrated in FIG. 5, the tandem OLED device 1 further includes a substrate 9 and a pixel definition layer 10 disposed on the substrate 9, and the anode 2 is located on the substrate 9. Before the step S402, further includes the steps as follow:

Forming the pixel definition layer 10 on the substrate 9 where the anode 2 is formed. Furthermore, the pixel definition layer 10 is corresponded to the anode 2 and is disposed with pixel openings 11, and the first organic electroluminescence unit 13 and the second organic electroluminescence unit 14 is formed in the pixel openings 11.

S403: forming a cathode on a side of the second electron injection layer away from the anode.

Illustrated in FIG. 2 is to form the cathode 12 on a side of the second electron injection layer 24 away from the anode 2.

Specifically, a material of the cathode 12 includes an aluminum metal or an alloy of a magnesium metal and a silver metal; the cathode 12 is formed by using an evaporation method, and a thickness of the cathode 12 is 150 nm.

In this embodiment, except the anode 2 and the cathode 12 of the tandem OLED device 1, each of the film layers of the first organic electroluminescence unit 13 and the second organic electroluminescence unit 14 in stacks can be manufactured by using the ink-jet printing method, which has advantages, such as a high material utilization rate and conducive to large-scale manufacturing, and lowers production costs and difficulty of the technology of the tandem OLED device 1 and prevents material waste. Using the ink-jet printing method to manufacture the tandem OLED device, on one hand it is necessary to select a solvent of an ink material of each layer to prevent from the solvent dissolving the bottom film layer during the ink-jet printing process, on the other hand, it is necessary to select a dissoluble electron transport material and a dissoluble electron injection material to manufacture the electron transport layer and the electron injection layer respectively. This embodiment provides the ink material recipes of the first hole injection layer 15, the first hole transport layer 16, the first light emitting layer 17, the first electron transport layer 18 and the first electron injection layer 19 of the first organic electroluminescence unit 13, and provides the ink material recipes of the second hole injection layer 20, the second hole transport layer 21, the second light emitting layer 22, the second electron transport layer 23, and the second electron injection layer 24 of the second organic electroluminescence unit 14. The ink material recipe of each layer includes appropriate solvents and functional materials, which prevents from the solvent dissolving the bottom film layer during the ink-jet printing process, and meanwhile ensures good performance of the manufactured tandem OLED device 1.

As illustrated in FIG. 5, an embodiment of the present disclosure further provides a tandem OLED device 1 manufactured by the manufacturing method mentioned above, including an anode 2, a cathode 12, and the organic electroluminescence component 25 disposed between the anode 2 and the cathode 12. The organic electroluminescence component 25 includes a plurality of organic electroluminescence units disposed in stacks, for example, the first organic electroluminescence unit 13 and the second organic electroluminescence unit 14 which are disposed in stacks. Furthermore, the first organic electroluminescence unit 13 includes a first hole injection layer 15, a first hole transport layer 16, a first light emitting layer 17, a first electron transport layer 18, and a first electron injection layer 19 which are disposed sequentially on the anode 2. The second organic electroluminescence unit 14 includes a second hole injection layer 20, a second hole transport layer 21, a second light emitting layer 22, a second electron transport layer 23, and a second electron injection layer 24 which are sequentially disposed on the first electron injection layer 19. The cathode 12 is disposed on a side of the second electron injection layer 24 away from the anode 2.

Specifically, the structures, the materials and the manufacturing methods of the first organic electroluminescence unit 13 and the second organic electroluminescence unit 14 are same.

Specifically, the tandem OLED device 1 further includes a substrate 9 and a pixel definition layer 10 disposed on the substrate 9, and the anode 2 is located on the substrate 9. The pixel definition layer 10 encircles the anode to form the pixel openings 11, and the first organic electroluminescence unit 13 and the second organic electroluminescence unit 14 in stacks is formed in the pixel openings 11.

Specifically, the plurality of anodes 2 are distributed on the substrate 9 in a compartmentalized manner, and a corresponded number of the pixel openings 11 is plural. The first organic electroluminescence unit 13 and the second organic electroluminescence unit 14 are stacked on the anode 2 in each of the pixel openings 11. The cathode 12 is covered on the second electron injection layer 24 and is covered on the pixel definition layer 10, that is, the cathodes 12 in the plurality of pixel openings 11 is continuous.

In this embodiment, except the anode 2 and the cathode 12 of the tandem OLED device 1, each of the film layers of the first organic electroluminescence unit 13 and the second organic electroluminescence unit 14 in stacks can be manufactured to obtain by using the ink-jet printing method, which has advantages, such as a high material utilization rate and conducive to large-scale manufacturing, making production costs of the tandem OLED device 1 be low and making production efficiency be high.

In summary, although the present disclosure has disclosed the preferred embodiments as above, however the above-mentioned preferred embodiments are not to limit to the present disclosure. A person skilled in the art can make any change and modification, therefore the scope of protection of the present disclosure is subject to the scope defined by the claims.

What is claimed is:

1. A manufacturing method of a tandem organic light emitting diode (OLED) device, comprising:
providing an anode;
using ink printing technology to form an organic electroluminescence component on the anode; wherein the organic electroluminescence component comprises a plurality of organic electroluminescence units disposed in stacks; each of the organic electroluminescence units comprises a hole injection layer, a hole transport layer, a light emitting layer, an electron transport layer, and an electron injection layer, which are disposed sequentially; and
forming a cathode on a side of the organic electroluminescence component away from the anode,
wherein materials of the hole injection layers in each of the organic electroluminescence units are same; an ink material used for manufacturing the hole injection layer comprises a poly(3,4-ethylenedioxythiophene) polystyrene sulfonate (PEDOT:PSS) intrinsically conductive polymer and a N,N-dimethylformamide solvent, and
wherein in the ink material used for manufacturing the hole injection layer, a mass fraction of the PEDOT:PSS intrinsically conductive polymer is 5%.

2. The manufacturing method of the tandem OLED device as claimed in claim 1, wherein materials of the hole transport layers of each of the organic electroluminescence units are same; an ink material used for manufacturing the hole transport layer comprises polyvinylcarbazole and a m-dichlorobenzene solvent.

3. The manufacturing method of tandem OLED device as claimed in claim 2, wherein in the ink material used for manufacturing the hole transport layer, a mass fraction of the polyvinylcarbazole is 8%.

4. The manufacturing method of tandem OLED device as claimed in claim 1, wherein materials of the light emitting layers of each of the organic electroluminescence units are same; an ink material used for manufacturing the light emitting layer comprises 2,6-bis[3-(9H-Carbazol-9-yl)phenyl]pyridine (26DCzPPy), tris(2-phenylpyridine)iridium (Ir(ppy)3), and a toluene solvent.

5. The manufacturing method of the tandem OLED device as claimed in claim 4, wherein in the ink material used for manufacturing the light emitting layer, a mass ratio of the 26Dczppy and the Ir(ppy)3 is 10:1, and a total mass fraction of the 26Dczppy and the Ir(ppy)3 is 5%.

6. The manufacturing method of the tandem OLED device as claimed in claim 1, wherein materials of the electron transport layers of each of the organic electroluminescence units are same; an ink material used for manufacturing the electron transport layer comprises zinc oxide nanoparticles and a 2-ethoxyethanol dispersant.

7. The manufacturing method of the tandem OLED device as claimed in claim 6, wherein in the ink material used for manufacturing the electron transport layer, the zinc oxide nanoparticles are distributed evenly in the 2-ethoxyethanol, and a mass fraction of the zinc oxide nanoparticles is 5%.

8. The manufacturing method of the tandem OLED device as claimed in claim 1, wherein materials of the electron injection layers of each of the organic electroluminescence units are same; an ink material used for manufacturing the electron injection layer comprises 4,7-diphenyl-1,10-phenanthroline (Bphen), a compound A, and a tetrahydrofuran solvent; wherein a chemical structure of the compound A as follows:

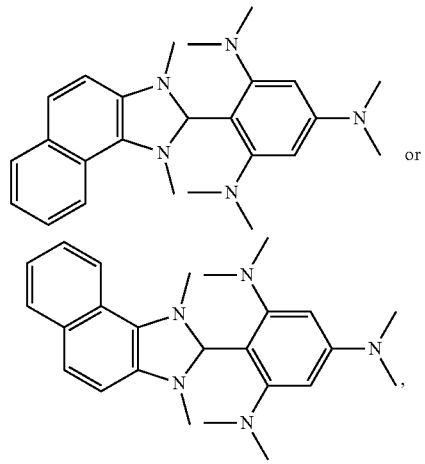

or, other derivatives of

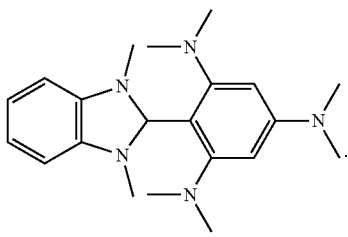 [SMILES: CN(C)c1cc(N(C)C)c(C2N(C)c3ccccc3N2C)c(N(C)C)c1]

9. The manufacturing method of the tandem OLED device as claimed in claim 8, wherein in the ink material used for manufacturing the electron injection layer, a mass ratio of the Bphen and the compound A is 20:1, a mass fraction of the Bphen and the compound A is 5%.

10. The manufacturing method of the tandem OLED device as claimed in claim 1, wherein in the plurality of organic electroluminescence units disposed in stacks, a compound A is doped in the electron injection layer of the organic electroluminescence unit adjacent to the anode, a chemical structure of the compound A is illustrated as follow:

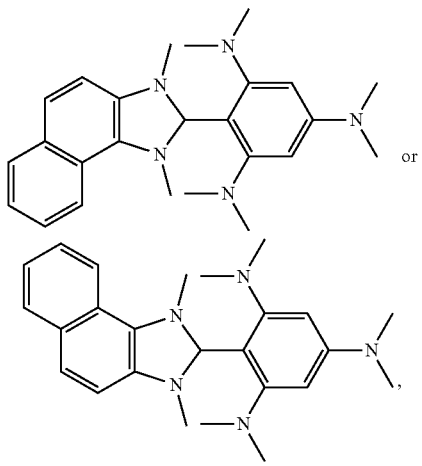

or or other derivatives of

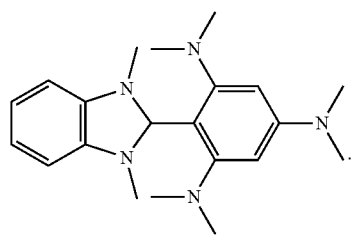 [SMILES: CN(C)c1cc(N(C)C)c(C2N(C)c3ccccc3N2C)c(N(C)C)c1]

11. The manufacturing method of the tandem OLED device as claimed in claim 1, wherein the tandem OLED device comprises a substrate and a pixel definition layer disposed on the substrate; the anode is disposed on the substrate;
before using the ink-jet printing technology to form the organic electroluminescence component on the anode, comprising following steps:
forming the pixel definition layer on the substrate where the anode is formed; wherein the pixel definition layer is corresponded to the anode and is disposed with pixel openings, and the organic electroluminescence component is formed in the pixel openings.

12. The manufacturing method of the tandem OLED device as claimed in claim 1, wherein a material of the cathode comprises an aluminum metal or an alloy of a magnesium metal and a silver metal.

13. The manufacturing method of the tandem OLED device as claimed in claim 1, wherein during manufacturing the hole injection layer, the hole transport layer, the light emitting layer, the electron transport layer, or the electron injection layer of each of the organic electroluminescence units, after ink printing a corresponding ink material, first drying in a vacuum, then baking at 80° C. to remove a solvent in the ink material.

14. A manufacturing method of a tandem organic light emitting diode (OLED) device, comprising:
providing an anode;
using an ink printing technology on the anode to form a first organic electroluminescence unit and a second organic electroluminescence unit on the anode which are disposed in stacks; wherein the first organic electroluminescence unit comprises a first hole injection layer, a first hole transport layer, a first light emitting layer, a first electron transport layer, and a first electron injection layer which are disposed sequentially on the anode; the second organic electroluminescence unit comprises a second hole injection layer, a second hole transport layer, a second light emitting layer, a second electron transport layer, and a second electron injection layer which are sequentially disposed on the first electron injection layer; and
forming a cathode on a side of the second electron injection layer away from the anode,
wherein an ink material used for manufacturing the first hole injection layer and the second hole injection layer comprises a poly(3,4-ethylenedioxythiophene) polystyrene sulfonate (PEDOT:PSS) intrinsically conductive polymer and a N,N-dimethylformamide solvent;
an ink material used for manufacturing the first hole transport layer and the second hole transport layer comprises polyvinylcarbazole and a m-dichlorobenzene solvent;
an ink material used for manufacturing the first light emitting layer and the second light emitting layer comprises 2,6-bis[3-(9H-Carbazol-9-yl)phenyl]pyridine (26DCzPPy), tris(2-phenylpyridine)iridium (Ir(ppy)3), and a toluene solvent;
an ink material used for manufacturing the first electron transport layer and the second electron transport layer comprises zinc oxide nanoparticles and a 2-ethoxyethanol dispersant; and
an ink material used for manufacturing the first electron injection layer and the second electron injection layer comprises 4,7-diphenyl-1,10-phenanthroline (Bphen), a compound A, and a tetrahydrofuran solvent; wherein a chemical structure of the compound A as follows:

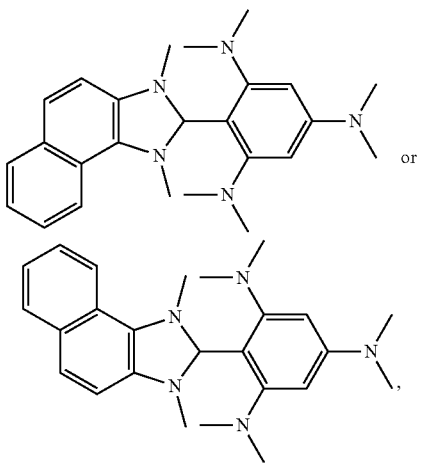

or other derivatives of

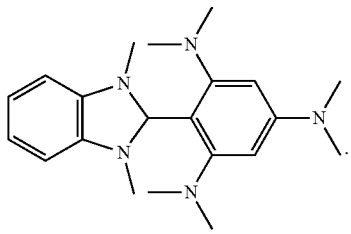 [SMILES: CN(C)c1cc(N(C)C)c(C2N(C)c3ccccc3N2C)c(N(C)C)c1]

15. The manufacturing method of the tandem OLED device as claimed in claim 14, wherein in the ink material used for manufacturing the first hole injection layer and the second hole injection layer, a mass fraction of the PEDOT:PSS intrinsically conductive polymer is 5%;

in the ink material used for manufacturing the first hole transport layer and a second hole transport layer, a mass fraction of the polyvinylcarbazole is 8%;

in the ink material used for manufacturing the first light emitting layer and the second light emitting layer, a mass ratio of the 26Dczppy and the Ir(ppy)3 is 10:1, and a total mass fraction of the 26Dczppy and the Ir(ppy)3 is 5%;

in the ink material used for manufacturing the first electron transport layer and the second electron transport layer, the zinc oxide nanoparticles are distributed evenly in the 2-ethoxyethanol, and a mass fraction of the zinc oxide nanoparticles is 5%; and in the ink material used for manufacturing the first electron injection layer and the second electron injection layer, a mass ratio of the Bphen and the compound A is 20:1, a mass fraction of the Bphen and the compound A is 5%.

* * * * *